United States Patent
Kuroda

(10) Patent No.: US 11,024,752 B2
(45) Date of Patent: *Jun. 1, 2021

(54) PHOTOELECTRIC CONVERSION DEVICE AND IMAGING SYSTEM HAVING STACKED STRUCTURE AND AVALANCHE AMPLIFICATION-TYPE DIODE

(71) Applicant: CANON KABUSHIKI KAISHA, Tokyo (JP)

(72) Inventor: Yukihiro Kuroda, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 72 days.

This patent is subject to a terminal disclaimer.

(21) Appl. No.: 16/268,400

(22) Filed: Feb. 5, 2019

(65) Prior Publication Data

US 2019/0252557 A1 Aug. 15, 2019

(30) Foreign Application Priority Data

Feb. 9, 2018 (JP) .............................. JP2018-022024

(51) Int. Cl.
| | |
|---|---|
| *H01L 31/02* | (2006.01) |
| *H01L 31/107* | (2006.01) |
| *G01J 1/44* | (2006.01) |
| *H01L 27/146* | (2006.01) |
| *H01L 31/054* | (2014.01) |

(52) U.S. Cl.
CPC .......... *H01L 31/02027* (2013.01); *G01J 1/44* (2013.01); *H01L 27/14634* (2013.01); *H01L 27/14643* (2013.01); *H01L 31/0543* (2014.12); *H01L 31/107* (2013.01); *G01J 2001/4466* (2013.01); *H01L 27/1461* (2013.01)

(58) Field of Classification Search
CPC ............. H01L 31/107; H01L 27/14634; H01L 27/14643; H01L 31/02027; H01L 27/146; H01L 27/14609; H01L 27/1461; G01J 1/44; G01J 2001/4466
USPC .......................................... 250/214 R, 208.1
See application file for complete search history.

(56) References Cited

U.S. PATENT DOCUMENTS

| | | | |
|---|---|---|---|
| 10,012,534 B2* | 7/2018 | Andreou | ............... H01L 31/107 |
| 2011/0017918 A1 | 1/2011 | Baeumer et al. | |
| 2014/0263975 A1 | 9/2014 | Nagano et al. | |
| 2015/0115131 A1 | 4/2015 | Webster et al. | |

FOREIGN PATENT DOCUMENTS

JP 2010-091377 A 4/2010

* cited by examiner

*Primary Examiner* — Que Tan Le
(74) *Attorney, Agent, or Firm* — Canon U.S.A., Inc. IP Division

(57) ABSTRACT

A photoelectric conversion device includes: an avalanche amplification-type diode; a pulse shaping circuit that shapes output from the avalanche amplification-type diode into a pulse; and a signal processing circuit that processes a signal corresponding to output from the pulse shaping circuit. A first base body in which the avalanche amplification-type diode is provided and a second base body in which the signal processing circuit is provided are stacked on each other, and the pulse shaping circuit is provided in the first base body.

22 Claims, 9 Drawing Sheets

PHOTOELECTRIC CONVERSION DEVICE AND IMAGING SYSTEM HAVING STACKED STRUCTURE AND AVALANCHE AMPLIFICATION-TYPE DIODE

BACKGROUND OF THE INVENTION

Field of the Invention

One disclosed aspect of the embodiments relates to a photoelectric conversion device and an imaging system.

Description of the Related Art

A photoelectric conversion device that digitally counts the number of photons reaching a photodiode and outputs the counted number from a pixel as a photoelectrically converted digital signal is known. There are many benefits in digitalizing pixel signals in terms of noise or signal calculation processing, and U.S. Patent Application Publication No. 2015/0115131 (hereinafter, referred to as Patent reference 1) discloses an imaging device in which a plurality of pixels that output photoelectrically converted digital signals are arranged. Further, Patent reference 1 discloses a configuration in which a sensor unit having a photodiode is provided in a first chip, a circuit unit having a circuit that processes a signal output from the photodiode is provided in a second chip, and the first chip and the second chip are stacked on each other. This intends to increase the integration and the speed of a photoelectric conversion device.

Patent reference 1 discloses that electrical connection between the first chip and the second chip is provided between a diode provided in the first chip and a digital counter provided in the second chip. That is, it is considered in Patent reference 1 that the junction between the first chip and the second chip corresponds to the output of the diode. In the configuration of Patent reference 1, however, it is not possible to count photons efficiently.

SUMMARY OF THE INVENTION

A photoelectric conversion device according to the present disclosure includes: an avalanche amplification-type diode; a pulse shaping circuit, and a signal processing circuit. The pulse shaping circuit shapes output from the avalanche amplification-type diode into a pulse. The signal processing circuit processes a signal corresponding to output from the pulse shaping circuit. A first chip in which the avalanche amplification-type diode is provided and a second chip in which the signal processing circuit is provided are stacked on each other. The pulse shaping circuit is provided in the first chip.

Further features of the present disclosure will become apparent from the following description of exemplary embodiments with reference to the attached drawings.

DESCRIPTION OF THE EMBODIMENTS

The present disclosure provides a configuration that can accurately count photons in a photoelectric conversion device that has the stacked structure and outputs a digital signal.

First Embodiment

A photoelectric conversion device according to the present embodiment is structured such that a first chip 101 and a second chip 201 are stacked on each other.

Figure 1:
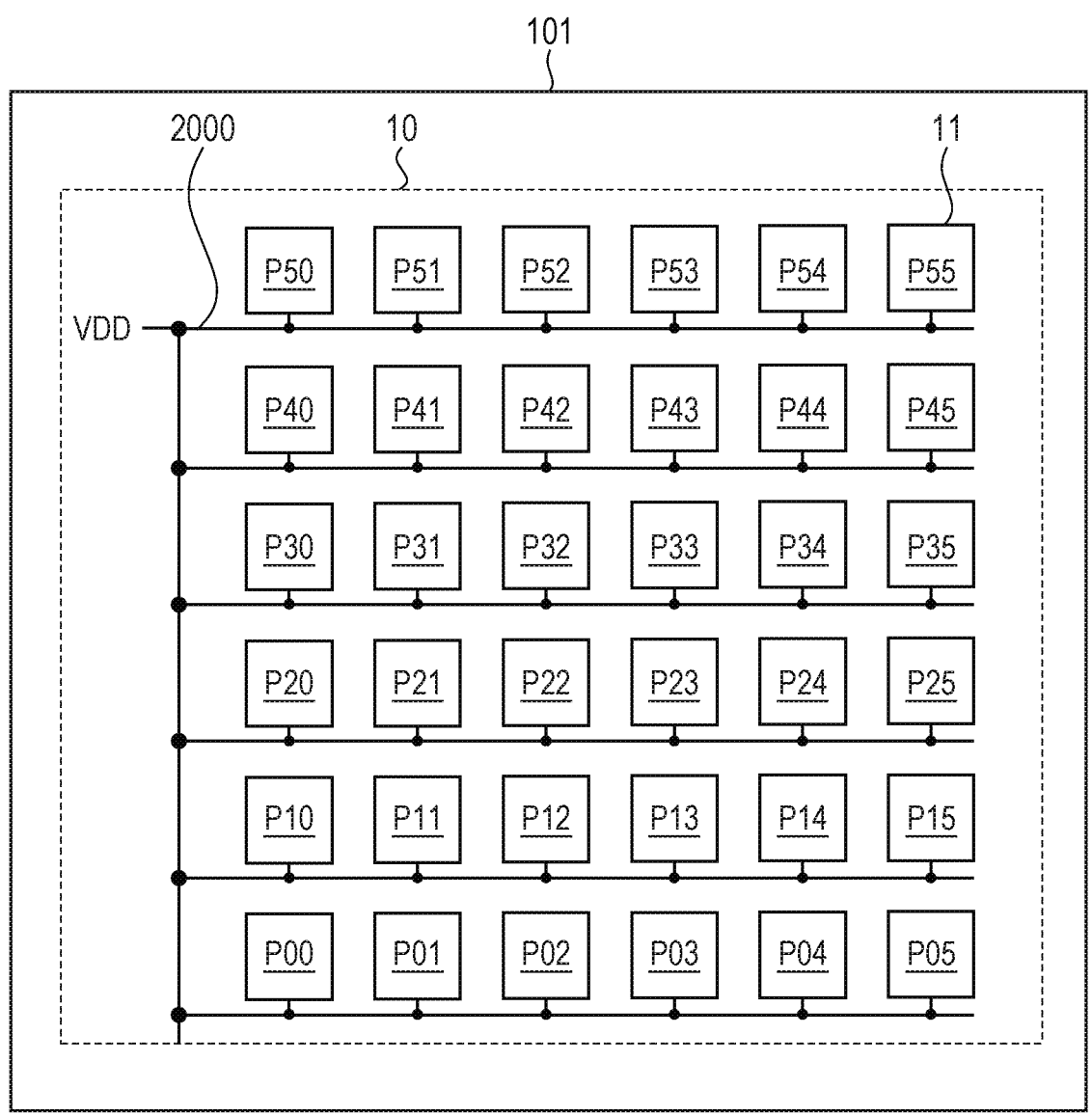
FIG. 1 is a configuration diagram of a photoelectric conversion device according to a first embodiment.

FIG. 1 is a configuration diagram of the first chip 101. The first chip 101 is provided with a sensor unit 10. The sensor unit 10 has a plurality of unit pixels 11. Each of the unit pixels 11 outputs a signal in accordance with an incidence of light. The plurality of unit pixels 11 are arranged in a matrix in the sensor unit 10. FIG. 1 illustrates a case where the unit pixels 11 of six rows by six columns denoted as P00 to P55 are arranged in the sensor unit 10. A voltage VDD is applied to pixel circuits arranged in the sensor unit 10 via a power source line 2000.

Figure 2:
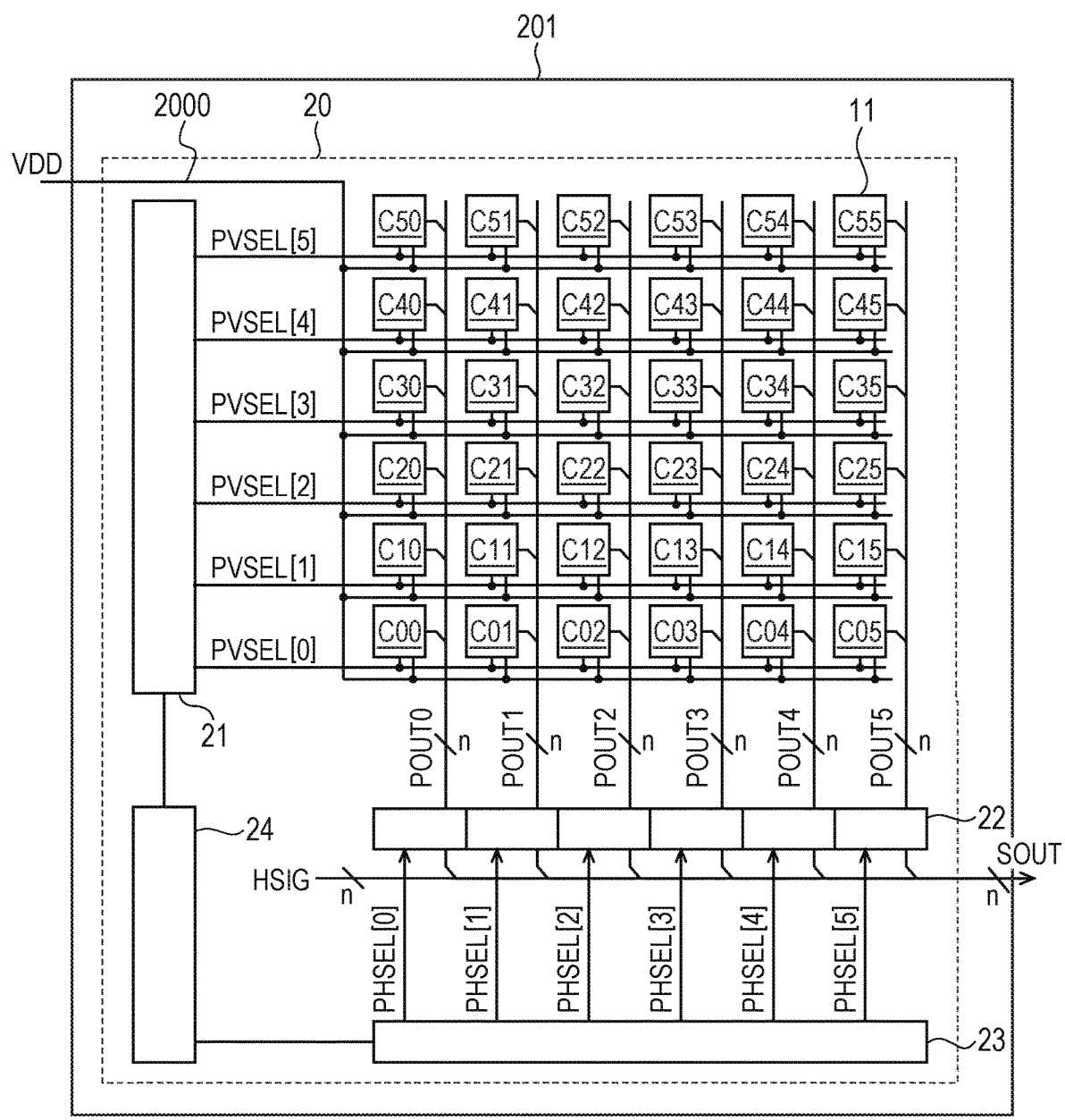
FIG. 2 is a configuration diagram of the photoelectric conversion device according to the first embodiment.

FIG. 2 is a configuration diagram of the second chip 201. The second chip 201 is provided with a circuit unit 20. A plurality of unit pixels 11 are arranged in a matrix, and the voltage VDD is supplied to each unit pixel 11. FIG. 2 illustrates a case where the unit pixels 11 of six rows by six columns denoted as C00 to C55 are arranged in the circuit unit 20, and each of the unit pixels C00 to C55 has a circuit that processes at least a signal output from a diode 12.

The circuit unit 20 has a vertical selection circuit 21 that drives the unit pixels 11, signal processing circuits 22 that process signals output from the unit pixels 11, a horizontal selection circuit 23 used for reading out signals from the signal processing circuits 22, and a control circuit 24 that controls the operation of each circuit. In FIG. 1, each signal line that provides a signal from the vertical selection circuit 21 is denoted as PVSEL, each output signal line that outputs a signal from each unit pixel 11 is denoted as POUT, each signal line that provides a signal from the horizontal selection circuit 23 is denoted as PHSEL, and each signal output line from the signal processing circuit 22 is denoted as S OUT. The voltage VDD is applied to circuits arranged in the circuit unit 20 via the power source line 2000.

Each of the plurality of signal processing circuits 22 is provided to each corresponding column included in a plurality of unit pixels 11. The signal processing circuit 22 has a function of holding a signal output from the unit pixels 11. Multiple output signal lines (n output signal lines in FIG. 2) are connected to the unit pixels 11 on a single column. Therefore, the signal processing circuit 22 corresponding to each column may hold a plurality of signals output from a single unit pixel.

Equivalent Circuit Diagram

Figure 3:
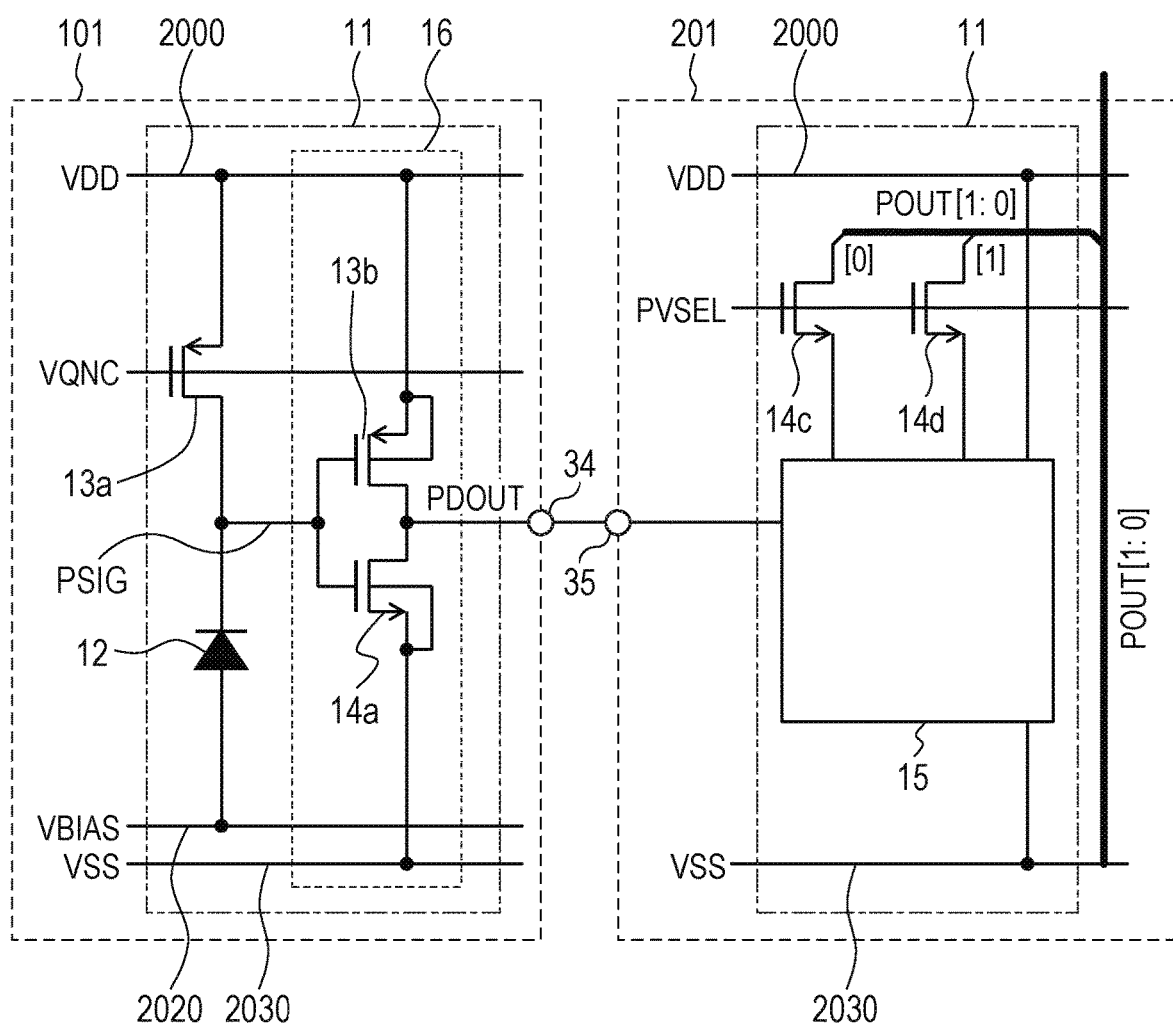
FIG. 3 is an equivalent circuit diagram of the photoelectric conversion device according to the first embodiment.

FIG. 3 is an equivalent circuit diagram illustrating a configuration example of the unit pixel 11. In FIG. 3, the unit pixel 11 has an avalanche amplification-type diode 12, P-channel metal oxide semiconductor (PMOS) transistors 13a and 13b, N-channel metal oxide semiconductor (NMOS) transistors 14a, 14c, and 14d, and a counter circuit 15.

A reverse bias that is larger than or equal to a breakdown voltage is applied to the diode 12, and the diode 12 is set to operate in a Geiger mode. Specifically, a voltage VBIAS (first power source voltage) is applied to the anode side of the diode 12 from a power source line 2020, the voltage VDD (second power source voltage) is applied to the cathode side from the power source line 2000, and the voltage difference between the voltage VBIAS and the voltage VDD is larger than or equal to the breakdown voltage. For example, the first power source voltage is larger than the second power source voltage, the first power source voltage is −20 V, and the second power source voltage is 3.3 V.

The PMOS transistor 13a is a quench element and forms a predetermined quench resistor with a voltage VQNC. When photons enter the diode 12, multiple electrons (and holes) are generated by an avalanche phenomenon. Flow of a current generated by the avalanche phenomenon in the quench element 13a causes a voltage drop, and the operation region of the diode 12 becomes out of the Geiger mode. Thereby, the avalanche phenomenon of the diode 12 stops, the voltage drop by the quench element 13a returns to the original state, and thus the operation region of the diode 12 is again in the Geiger mode.

The PMOS transistor 13b and the NMOS transistor 14a form an inverter circuit 16 and invert and amplify a change in the potential of the cathode of the diode 12 (output PSIG). Since the inverter circuit 16 enables the unit pixel 11 to shape a signal representing the presence or absence of a photon incidence into a pulse signal, the inverter circuit 16 may be referred to as a "pulse shaping circuit".

The counter circuit 15 counts the number of pulses output from the inverter circuit 16 and outputs an accumulated count result to the output signal line POUT via switches of the NMOS transistors 14c and 14d.

Control of turning on/off the NMOS transistors 14c and 14d is performed on the signal line PVSEL. FIG. 3 illustrates a case having a two-bit counter as an example.

The source of the PMOS transistor 13a and the source of the PMOS transistor 13b are connected to the power source line 2000 and supplied with the voltage VDD. Further, the counter circuit 15 is also connected to the power source line 2000 and supplied with the voltage VDD.

The voltage difference between the voltage VBIAS (first power source voltage) and the voltage VDD (second power source voltage) requires such a voltage difference that causes the diode 12 to operate in a Geiger mode. For example, when the voltage VBIAS (first power source voltage) is −20 V, the voltage VDD (second power source voltage) is 3.3 V. Further, it is preferable to adapt the voltage supplied to the inverter circuit 16 to the amplitude of an analog signal from the quench element 13a. Accordingly, in the present embodiment, the voltage supplied to the inverter circuit 16 is configured to be supplied from the power source line 2000, and the voltage VDD is applied to the inverter circuit 16. For example, the voltage VDD is 3.3 V, and a voltage VSS of a power source line 2030 is 0 V.

The output PDOUT from the inverter circuit 16 is transferred to the second chip 201 via a first connection part 34 and a second connection part 35 and input to the counter circuit 15.

The voltage VDD from the power source line 2000 and the voltage VSS from the power source line 2030 are applied to the transistor of the counter circuit 15.

Comparative Example and Advantageous Effect of Present Embodiment

Figure 4A:
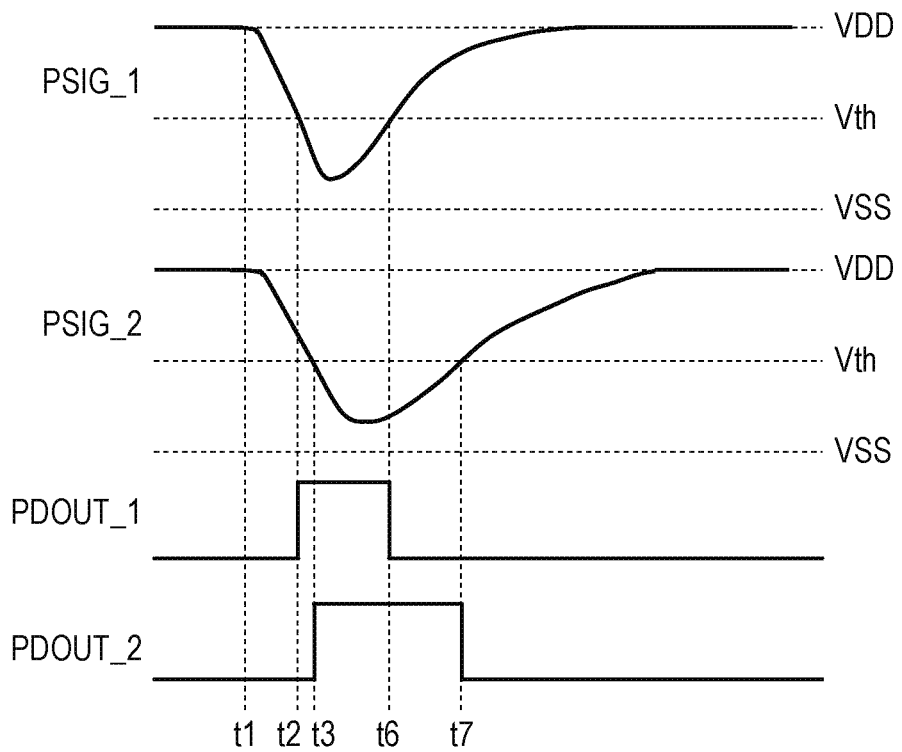
FIG. 4A and FIG. 4B are conceptual diagrams illustrating an advantage of the photoelectric conversion device according to the first embodiment.
Figure 4B:
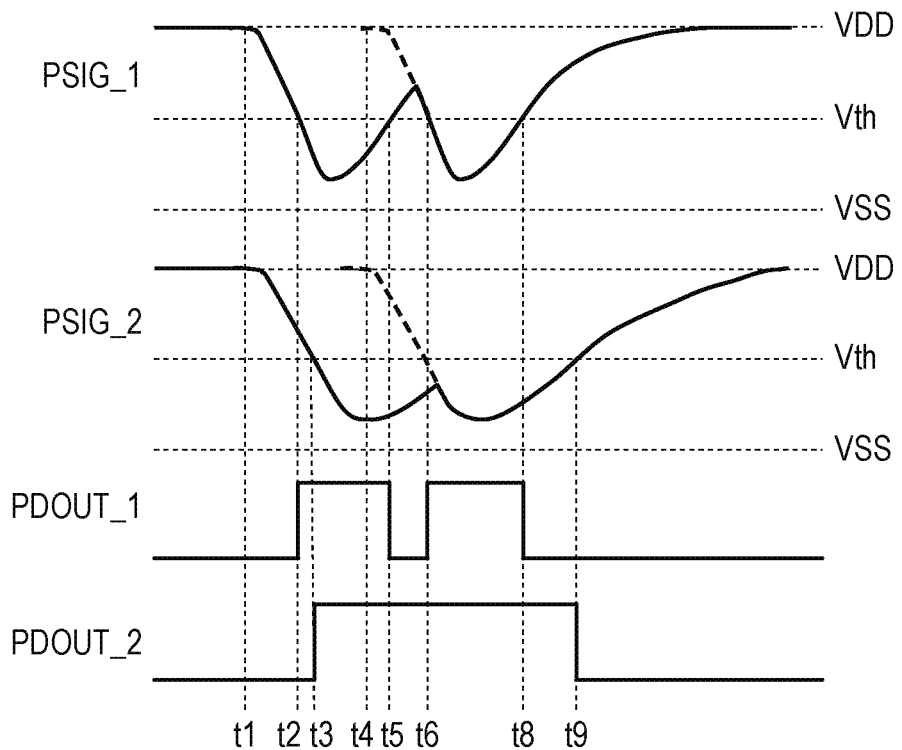

FIG. 4A and FIG. 4B are diagrams illustrating a process in which the presence or absence of a photon incidence is converted into a voltage pulse signal. The output PSIG represents an output waveform from the diode 12, and the output PDOUT represents an output waveform from the inverter circuit 16.

Output PSIG_1 and output PDOUT_1 are waveforms corresponding to the present embodiment, and output PSIG_2 and output PDOUT_2 are waveforms corresponding to Patent reference 1 (comparative example).

At time t1, in response to a photon entering the diode 12, a current generated by an avalanche phenomenon flows in the quench element 13a. At this time, a voltage drop occurs in the output PSIG_1 of the diode 12. At time t2, in response to the output PSIG_1 exceeding an inversion threshold Vth of the inverter circuit 16, the output PDOUT_1, which is the output of the inverter circuit 16, becomes a High level corresponding to an inverted signal that is the pulse-shaped version of the output PSIG_1. Next, the voltage drop in the output PSIG_1 returns to the original state due to the quench element 13a. At time t6, in response to the output PSIG_1 exceeding the inversion threshold Vth of the inverter circuit 16 again, the output PDOUT_1 becomes a Low level corresponding to an inverted signal that is the pulse-shaped version of the output PSIG_1.

As illustrated in FIG. 4A, the width of the pulse PDOUT_1 in which the presence or absence of an incident light is converted is determined by the time constant of the output PSIG_1. This time constant includes a junction capacitance of a PN junction of a diode, a load of a quench element, a load of a wiring, and the like.

In contrast, if the junction between the first chip 101 and the second chip 201 were the same node as the output of the diode 12 as illustrated in Patent reference 1 (comparative example), the time constant at the output node of the diode 12 is necessarily larger. Specifically, in FIG. 4A, the output of the diode 12 will be similar to the output PSIG_2. As a result, in response to the output PSIG_2 exceeding the inversion threshold Vth of the inverter circuit 16 at time t3, the output PDOUT_2 becomes a High level corresponding to an inverted signal that is the pulse-shaped version of the output PSIG_2. Next, after the voltage drop in the output PSIG_2 returns to the original state and, in response to the output PSIG_2 exceeding the inversion threshold Vth of the inverter circuit 16 again at time t7, the output PDOUT_2 of the inverter circuit 16 becomes a Low level corresponding to an inverted signal that is the pulse-shaped version of the output PSIG_2. As discussed above, the pulse width of the output PDOUT_2 in the case of a larger time constant of the output from the diode 12 is longer than the pulse width of the output PDOUT_1 in the case of a smaller time constant.

Next, the influence in the case of a larger time constant at the output node of the diode 12 will be described by using FIG. 4B. FIG. 4B illustrates the output PSIG of the diode 12 and the output PDOUT of the inverter circuit 16 when photons enter the diode 12 at time t1 and time t4.

In the output PSIG, a waveform of voltage change due to incident photons at time t4 is depicted by dotted lines. Note that, before a voltage drop caused by the incident photons at time t1 and the quench element completely returns to the original state, a voltage drop caused by the incident photons at time t4 and the quench element starts, and thus the observed voltage change results in a waveform illustrated by solid lines.

In the output PDOUT_1, in response to the output PSIG_1 exceeding the inversion threshold Vth of the inverter circuit 16 at time t2, the output PDOUT_1 becomes a High level corresponding to an inverted signal that is the pulse-shaped version of the output PSIG_1. At time t5, since the output PSIG_1 exceeds the inversion threshold Vth, the output PDOUT_1 becomes a Low level. After time t5, a voltage drop occurs again due to the photons that have entered the diode 12 at time t4. At time t6, since the output PSIG_1 exceeds the inversion threshold Vth, the output PDOUT_1 becomes a High level. At time t8, since the output PSIG_1 exceeds the inversion threshold Vth, the output PDOUT_1 becomes a Low level.

On the other hand, in the output PDOUT_2, at time t3, in response to the output PSIG_2 exceeding the inversion threshold Vth of the inverter circuit 16, the output PDOUT_2 becomes a High level corresponding to an inverted signal that is the pulse-shaped version of the output PSIG_2. The output PSIG_2 does not reach the inversion threshold Vth due to a large time constant even after time t6. Next, a voltage drop of the output PSIG_2 starts again due to photons that have entered the diode 12 at time t4 and the quench element. Then, the voltage drop returns to the original state, the output PDOUT_2 exceeds the inversion threshold Vth of the inverter circuit 16 at time t9, and the output PDOUT_2 becomes a Low level.

As illustrated in FIG. 4B, in the output PDOUT_1, when two photons have reached the diode, the pulse signal having pulses corresponding to two photons is generated in the signal. On the other hand, in the output PDOUT_2, although two photons have reached the diode, the pulse signal having only one pulse corresponding to one photon is generated in the signal because the photon that has entered the diode 12 at time t4 is not converted.

As discussed above, it is necessary to reduce the time constant at the output node of the diode 12 in order to accurately detect the presence or absence of a photon incidence. In the present embodiment, since the junction between the first chip 101 and the second chip 201 corresponds to the output node of the inverter circuit 16 on the post-stage of pulse conversion, the time constant at the output node of the diode 12 can be reduced compared to the case where the junction corresponds to the output node of the diode 12. As a result, the presence and absence of a photon incidence can be accurately detected.

Sectional View

Figure 5:
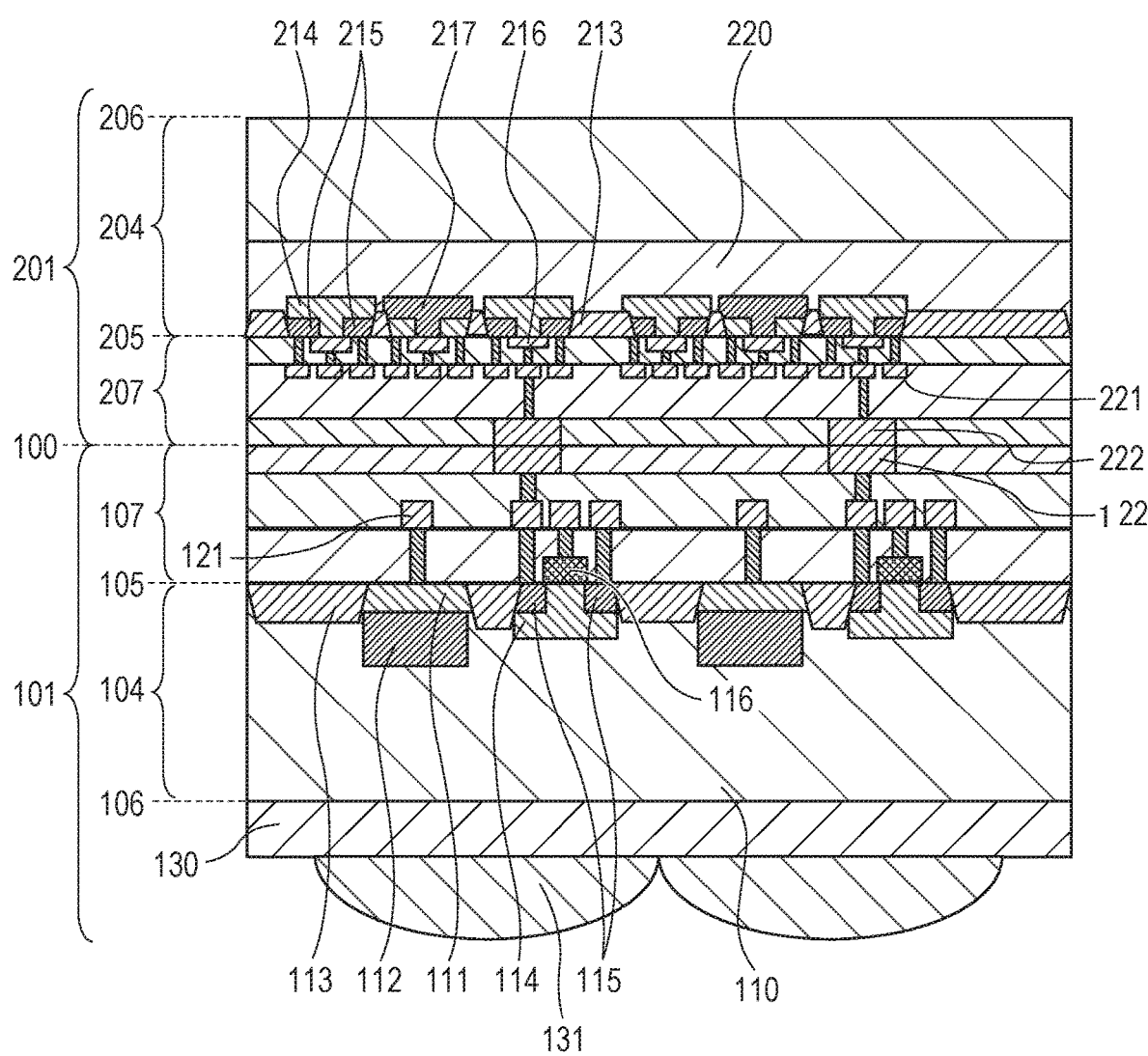
FIG. 5 is a sectional view of the photoelectric conversion device according to the first embodiment.

FIG. 5 is a sectional view of a photoelectric conversion device according to the present embodiment. FIG. 5 illustrates the first chip 101, the second chip 201, and a junction interface 100 between the first chip 101 and the second chip 201. The first chip 101 has a first substrate 104. In the first substrate 104, a face on which wiring layers are formed is defined as a primary face 105, and a face opposite thereto is defined as a backside face 106. The first substrate 104 includes an N-type region 111 and a P-type region 112 in which a photodiode is formed in a well 110, a well region 114 forming a transistor, a source and drain region 115, a gate electrode 116, and an element isolation region 113. Further, a multilayer wiring structure 107 including a first wiring layer 121 and a second wiring layer 122 is formed on the primary face 105 side of the first substrate 104 of the first chip 101. In this embodiment, for example, a plug made of tungsten is used for connection between the wiring of the first wiring layer 121 and the wiring of the second wiring layer 122, connection between the gate electrode and the wiring of the first wiring layer 121, or the like. The first chip 101 further has a color filter layer 130 including planarization layer or the like and a micro lens 131 on the backside face 106 side of the first substrate 104.

The second chip 201 has a second substrate 204. In the second substrate 204, a face on which a transistor is formed is defined as a primary face 205, and a face opposite thereto is defined as a backside face 206. A multilayer wiring structure 207 including a first wiring layer 221 and a second wiring layer 222 is formed on the primary face 205 of the second substrate 204. An N-type well region 214, a P-type well region 217, a source and drain region 215, a gate electrode 216, and an element isolation region 213 that form a transistor are provided in a well 220. For example, a plug made of tungsten is used for connection between the wiring of the first wiring layer 221 and the wiring of the second wiring layer 222, connection between the gate electrode and the wiring of the first wiring layer 221, or the like.

In the photoelectric conversion device of the present embodiment here, the first chip 101 and the second chip 201 are stacked on such that the primary face 105 and the primary face 205 of respective substrates face each other. The wiring of the second wiring layer 122, which is the uppermost layer of the multilayer wiring structure 107 of the first chip 101, and the wiring of the second wiring layer 222, which is the uppermost layer of the multilayer wiring structure 207 of the second chip 201, are in contact with each other at the junction interface 100, and thereby electrical connection is secured. With respect to the configuration of the connection portion between the first chip 101 and the second chip 201, only the connection between the drain region 115 of the P-type transistor of the first chip 101 and the gate electrode 216 of the P-type transistor of the second chip 201 is depicted. Further, the photoelectric conversion device of the present embodiment is a backside incident type photoelectric conversion device which a light enters from the backside face 106 side of the first substrate 104.

Second Embodiment

The present embodiment is the same as the first embodiment in that the first chip and the second chip are stacked on each other and the pulse shaping circuit is provided in the first chip. However, the present embodiment is different from the first embodiment in that a pulse conversion circuit is further provided.

Figure 6:
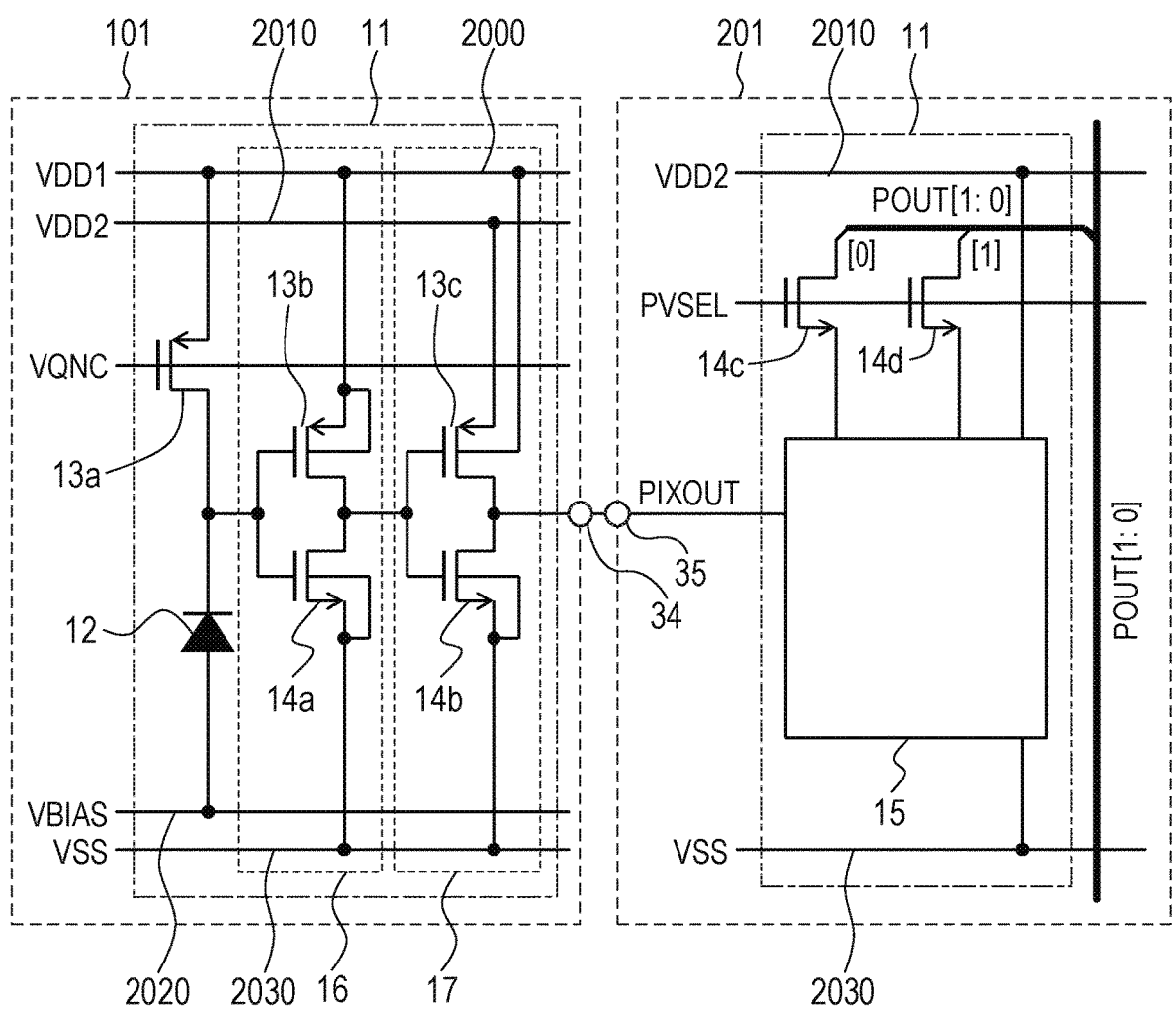
FIG. 6 is an equivalent circuit diagram of a photoelectric conversion device according to a second embodiment.

FIG. 6 is an equivalent circuit diagram illustrating a configuration example of the unit pixel 11. The functions or the like of members provided with the same references as those of FIG. 3 are the same as described above.

The inverter circuit 16 (pulse shaping circuit) inverts and amplifies a change of the potential at the cathode of the diode 12 and shapes a signal representing the presence and absence of a photon incidence into a pulse signal. Further, the PMOS transistor 13c and the NMOS transistor 14b form an inverter circuit 17 and output the inverted signal, which is the output of the inverter circuit 16, to the counter circuit 15.

The source of the PMOS transistor 13a and the source of the PMOS transistor 13b are connected to the power source line 2000 and supplied with the voltage VDD1. Further, the counter circuit 15 is also connected to the power source line 2010 and supplied with the voltage VDD2.

The voltage VDD1 (second power source voltage) applied to the quench element 13a is required to be a high voltage in terms of a Geiger mode operation of the diode 12. For example, as described above, when the voltage VBIAS (first power source voltage) supplied to the power source line 2020 is −20 V, the voltage VDD1 (second power source voltage) is required to be 3.3 V. Further, it is necessary to adapt the voltage supplied to the inverter circuit 16 to the amplitude of an analog signal from the quench element 13a. The PMOS transistor 13a of the quench element is in an ON-state due to the voltage VQNC. Thus, when there is no incident light, the potential of the cathode terminal of the diode 12 is VDD1. A large current can flow in the PMOS transistor 13a due to an avalanche phenomenon of the diode 12 caused by a photon incidence. At this time, a voltage drop occurs in the potential of the cathode terminal of the diode 12, and the amplitude thereof depends on characteristics of the diode 12 or the PMOS transistor 13a and has large variation. Thus, the voltage supplied to the inverter circuit 16 is required to be a high voltage in order to use the inverter circuit 16 to shape a signal representing the presence or absence of a photon incidence into a pulse signal in a reliable manner. In the present embodiment, the voltage supplied to the inverter circuit 16 is configured to be supplied from the power source line 2000, and the voltage VDD1 is applied to the inverter circuit 16. For example, the voltage VDD1 is 3.3 V, and the voltage VSS of the power source line 2030 is 0V.

On the other hand, as a transistor of the counter circuit 15, a finer transistor, that is, a transistor that is driven at a lower voltage than the transistor of the quench element 13a or the inverter circuit 16 is used in taking the number of elements of the circuit or the operation speed into consideration. Specifically, the voltage VSS (third power source voltage) is supplied to the counter circuit 15 from the power source line 2030 and the voltage VDD2 (fourth power source voltage) is supplied to the counter circuit 15 from the power source line 2010. Thus, the amplitude of a pulse signal in the counter circuit 15 corresponds to the difference between the third power source voltage and the fourth power source voltage. For example, when the voltage VSS is 0 V and the voltage VDD2 is 1.8 V, the amplitude of the pulse signal is 1.8 V. Accordingly, in the present embodiment, the difference between the first power source voltage and the second power source voltage is larger than the difference between the third power source voltage and the fourth power source voltage.

On the other hand, the voltage VSS (fifth power source voltage) is supplied to the inverter circuit 16 from the power source line 2030 and the voltage VDD1 (sixth power source voltage) is supplied to the inverter circuit 16 from the power source line 2000. Thus, the amplitude of the pulse signal output from the inverter circuit 16 corresponds to the difference between the fifth power source voltage and the sixth power source voltage. For example, when the voltage VSS is 0 V and the voltage VDD1 is 3.3 V, the amplitude of the pulse signal output from the inverter circuit 16 is 3.3 V.

The amplitude of the pulse signal in the counter circuit 15 (for example, 1.8 V) is different from the amplitude of the pulse signal output from the inverter circuit 16 (for example, 3.3 V). When a counter circuit is formed of a transistor that operates in a lower voltage for reduction in size and increase in speed, it is preferable that the amplitudes of these pulse signals be matched as much as possible in terms of withstand voltage or reliability. Accordingly, in the present embodiment, the inverter circuit 17 is provided to convert a pulse signal having a first amplitude output from the inverter circuit 16 into a pulse signal having a second amplitude that is smaller than the first amplitude. Because of such a function, the inverter circuit 17 may be referred to as a "pulse conversion circuit".

For example, the voltage VSS (seventh power source voltage) of the power source line 2030 supplied to the inverter circuit 17 is 0 V, and the voltage VDD2 (eighth power source voltage) of the power source line 2010 is 1.8 V. In this case, the amplitude of the pulse signal is converted from 3.3 V at the input of the inverter circuit 17 into 1.8 V at the output of the inverter circuit 17. As described above, since the amplitude of the pulse signal in the counter circuit is 1.8 V, for example, when the inverter circuit 17 is provided, the amplitude of the pulse signal input to the counter circuit 15 is set to a suitable value.

According to the configuration of the present embodiment, the time constant of the output node of the diode 12 can be smaller compared to the case where the junction between the first chip 101 and the second chip 201 is the same node as the output node of the diode 12. As a result, the presence or absence of a photon incidence can be accurately detected.

Further, since a finer transistor that can be driven at a lower voltage can be used in the second chip 102, an advanced function or a higher speed can be achieved.

Modified Example of Pulse Shaping Circuit

Figure 7:
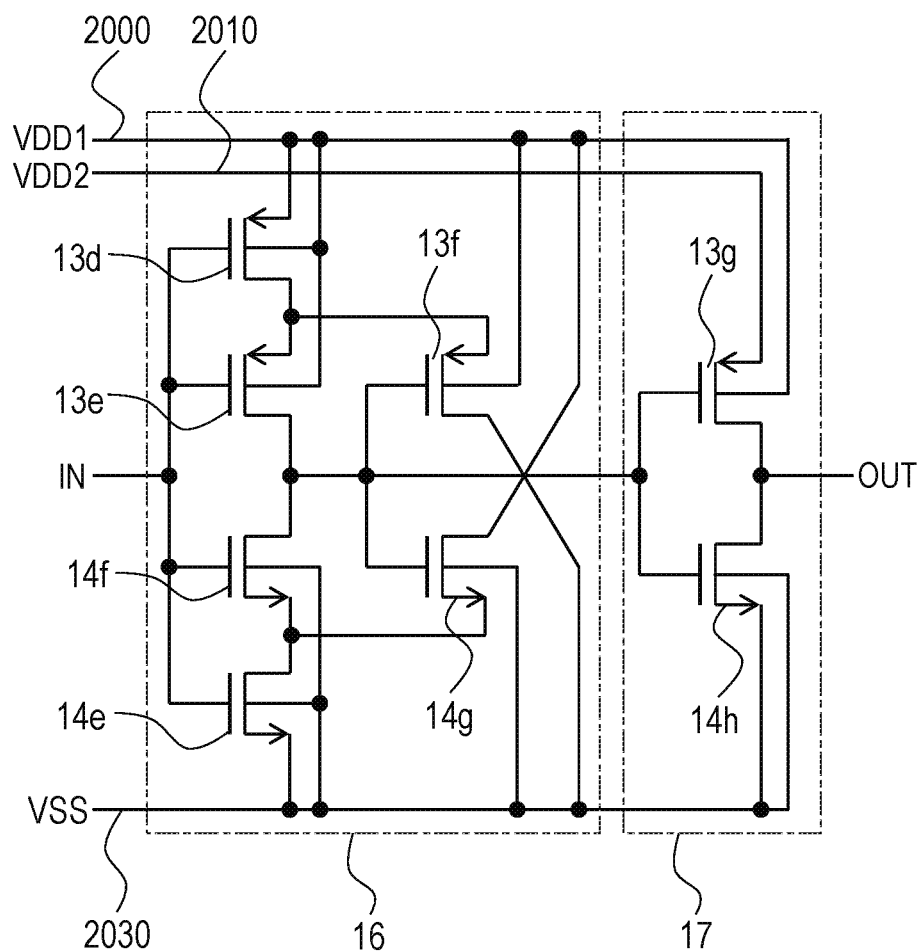
FIG. 7 is a configuration diagram related to a modified example of the photoelectric conversion device according to the second embodiment.

FIG. 7 illustrates another configuration example of a pulse shaping circuit (the inverter circuit 16) and a pulse conversion circuit (the inverter circuit 17) described above.

The pulse shaping circuit 16 illustrated in FIG. 7 is formed of PMOS transistors 13d to 13f and NMOS transistors 14f and 14g. The PMOS transistor 13e and the NMOS transistor 14f form an inverter. The drain of the PMOS transistor 13d and the source of the PMOS transistor 13f are connected to the source of the PMOS transistor 13e. Furthermore, the source of the PMOS transistor 13d is connected to the power source line 2000, and the drain of the PMOS transistor 13f is connected to the power source line 2030. The PMOS transistors 13d and 13f control the source potential of the PMOS transistor 13e via the drains of the PMOS transistors 13d and 13f supplied with respective gate potentials. Similarly, the drain of the NMOS transistor 14e and the source of the NMOS transistor 14g are connected to the source of the NMOS transistor 14f. Furthermore, the source of the NMOS transistor 14e is connected to the power source line 2030, and the drain of the NMOS transistor 14g is connected to the power source line 2000. The NMOS transistors 14e and 14g control the source potential of the NMOS transistor 14f via the drains of the NMOS transistors 14e and 14g supplied with respective gate potentials. Therefore, the pulse shaping circuit 16 forms a Schmitt trigger circuit in which the output state changes with a hysteresis with respect to a change of the input potential.

The inverter circuit (pulse conversion circuit) 17 is formed of a PMOS transistor 13g and an NMOS transistor 14h and converts the high level of the output pulse from the voltage VDD1 to the voltage VDD2.

As illustrated in FIG. 7, with the pulse shaping circuit 16 being a Schmitt trigger circuit, there is an advantage of an easily adjustable threshold used when the output signal of the diode 12 is pulsed.

Modified Examples

The example in which the difference value between the third power source voltage and the fourth power source voltage is equal to the difference value between the seventh power source voltage and the eighth power source voltage has been described above. That is, the amplitude of the pulse signal of the counter circuit 15 and the amplitude of the pulse signal of the output from the inverter circuit 17 are equal to each other. However, focusing on the feature that there is a difference between the amplitude of a pulse signal output from the inverter circuit 16 and the amplitude of a pulse signal of the counter circuit 15, the technical object specific to the present embodiment is to reduce such a difference. Thus, the above condition of the equal amplitude is not a requirement. That is, the value of each power source voltage can be suitably set as long as the condition that (the difference between the fifth power source voltage and the sixth power source voltage)>(the difference between the seventh power source voltage and the eight power source voltage) (the difference between the third power source voltage and the fourth power source voltage) is satisfied. That is, with respect to the fifth to eighth power source voltages, the difference between the seventh power source voltage and the eighth power source voltage may be greater than or equal to the difference between the third power source voltage and the fourth power source voltage.

Further, it can be said from another point of view that the technical object of the present disclosure can be achieved when the amplitude of a pulse signal output from the inverter circuit 16 is reduced by the inverter circuit 17. In this case, the value of each power source voltage can be suitably set as long as the condition that (the difference between the fifth power source voltage and the sixth power source voltage)> (the difference between the seventh power source voltage and the eight power source voltage) is satisfied.

Furthermore, the first power source voltage to the eighth power source voltage can be voltages of different values. As with the configuration of the present embodiment, however, with the second power source voltage and the sixth power source voltage being the same value (equal), the power source lines can be shared, and therefore the device structure can be simplified. Similarly, the third power source voltage, the fifth power source voltage, and the seventh power source voltage may be the same value, and thereby the power source lines can be shared. Similarly, the fourth power source voltage and the eighth power source voltage may be the same value, and thereby the power source lines can be shared.

Third Embodiment

Figure 8:
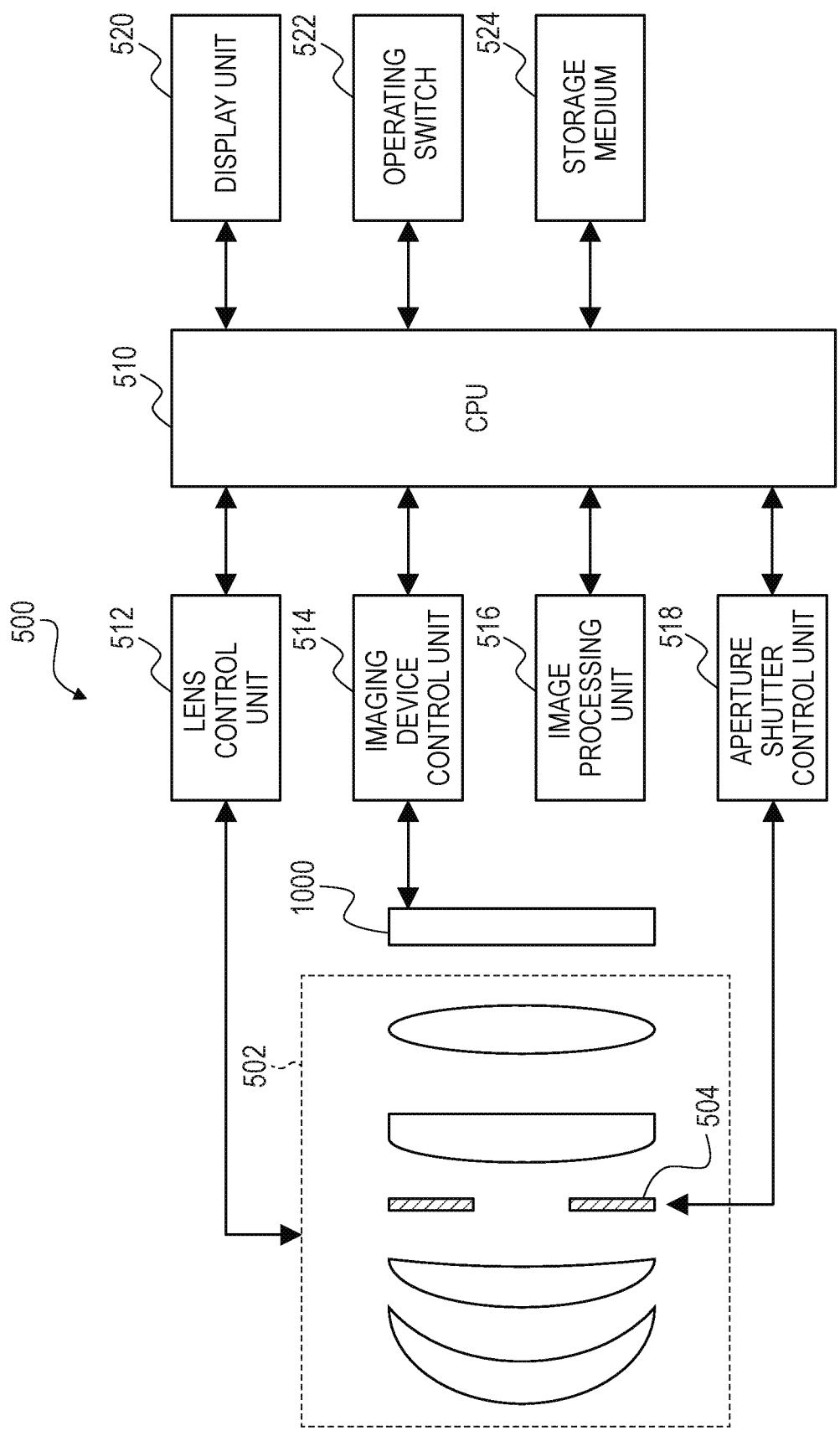
FIG. 8 is a configuration diagram of an imaging system according to a third embodiment.

An imaging system according to a third embodiment of the present disclosure will be described by using FIG. 8. FIG. 8 is a block diagram illustrating a general configuration of the imaging system according to the present embodiment.

The photoelectric conversion devices described in the above embodiments are applicable to various imaging systems. As an applicable imaging system is not particularly limited and may be various devices such as a digital still camera, a digital camcorder, a surveillance camera, a copy machine, a fax machine, a mobile phone, an on-vehicle camera, an observation satellite, a medical camera, or the like, for example. A camera module having an optical system such as lenses and a photoelectric conversion device is included in the imaging system. FIG. 8 illustrates a block diagram of a digital still camera as an example of the above devices.

An imaging system 500 has a photoelectric conversion device 1000, an imaging optical system 502, a CPU 510, a lens control unit 512, an imaging device control unit 514, an image processing unit 516, an aperture shutter control unit 518, a display unit 520, an operating switch 522, and a storage medium 524.

The imaging optical system 502 is an optical system used for forming an optical image of a subject and includes a lens group and an aperture 504 or the like. The aperture 504 has a function of light amount adjustment at the time of capturing by adjusting the aperture diameter and, in addition, a function as a shutter used for exposure time adjustment when capturing a static image. The lens group and the aperture 504 are held so as to be retractable along the optical axis direction, and a magnification function (zoom function) or a focus adjustment function is implemented by the interlocking operation thereof. The imaging optical system 502 may be integrated with the imaging system or may be an image capturing lens that can be attached to the imaging system.

A photoelectric conversion device 1000 is arranged in an image space of the imaging optical system 502 so that the image capturing plane is located therein. The photoelectric conversion device 1000 is a photoelectric conversion device described in the first or second embodiment. The photoelectric conversion device 1000 photoelectrically converts a subject image captured by the imaging optical system 502 and outputs the subject image as an image signal or a focus detection signal.

The lens control unit 512 is used to control forward and backward driving of the lens group of the imaging optical system 502 to perform magnification operation or focus adjustment and is formed of a circuit and a processing device configured to implement such a function. The aperture shutter control unit 518 changes the aperture diameter of the aperture 504 (changes an aperture value) to adjust a capturing light amount and is formed of a circuit and a processing device configured to implement such a function.

The CPU 510 is a control device inside a camera that is responsible for various control of the camera unit and includes a calculation unit, a ROM, a RAM, an analog-to-digital (A/D) converter, a digital-to-analog (D/A) converter, a communication interface circuit, or the like. The CPU 510 controls the operation of each unit within the camera in accordance with a computer program stored in the ROM or the like and performs a series of capturing operations such as AF including detection of a focus state (focus detection) of the imaging optical system 502, capturing, image processing, storage, and the like. The CPU 510 is also a signal processing unit.

The imaging device control unit 514 is for controlling the operation of the photoelectric conversion device 1000, performing A/D conversion on a signal output from the photoelectric conversion device 1000, and transmitting the converted digital signal to the CPU 510 and is formed of a circuit and a control device configured to implement such a function. The A/D conversion function may be provided in the photoelectric conversion device 1000. The image processing unit 516 is for performing image processing such as gamma conversion, color interpolation, or the like on the signal obtained after A/D conversion to generate an image signal and is formed of a circuit and a control device configured to implement such a function. The display unit 520 displays information on a capturing mode of the camera, a preview image before capturing, a review image after capturing, a focusing state at focus detection, or the like. The operating switch 522 is formed of a power source switch, a release (capturing trigger) switch, a zoom operation switch, a capturing mode selection switch, or the like. The storage medium 524 is for storing captured images or the like, which may be built in the imaging system or may be removable such as a memory card.

The imaging system 500 to which the photoelectric conversion device 1000 described in the above embodiments is applied is configured in such a way, and thereby a high-performance imaging system can be realized.

Fourth Embodiment

Figure 9A:
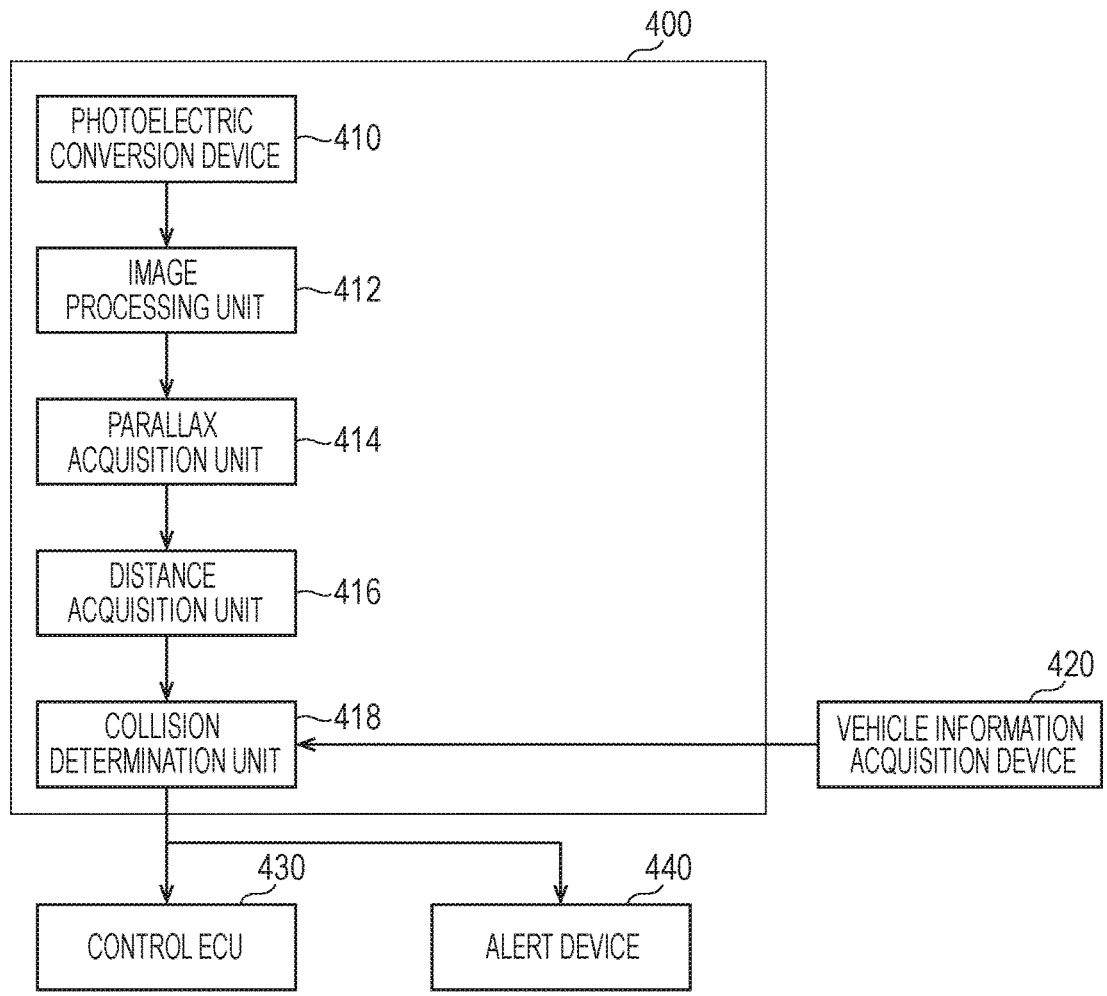
FIG. 9A and FIG. 9B are configuration diagrams of a moving unit according to a fourth embodiment.
Figure 9B:
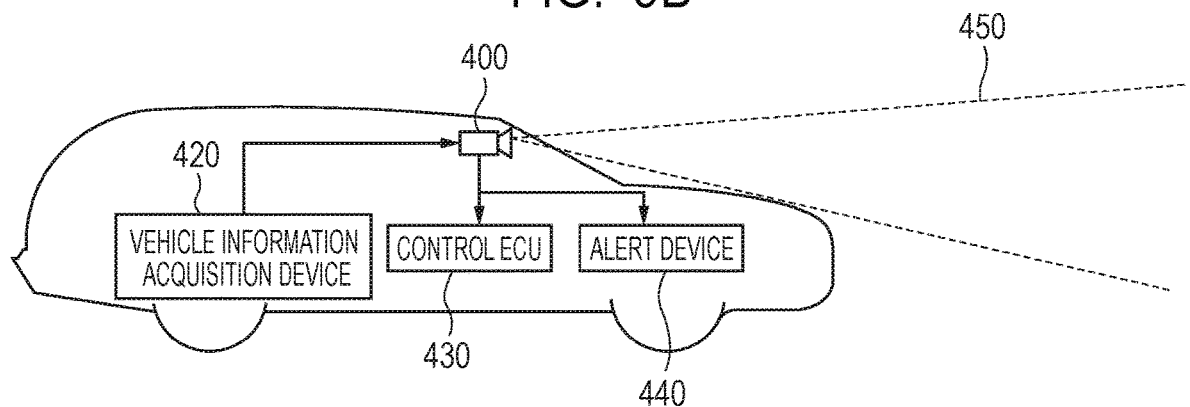

An imaging system and a moving unit according to a fourth embodiment of the present disclosure will be described by using FIG. 9A and FIG. 9B. FIG. 9A and FIG. 9B are diagrams illustrating the configuration of the imaging system and the moving unit according to the present embodiment.

FIG. 9A illustrates an example of an imaging system 400 related to an on-vehicle camera. The imaging system 400 has a photoelectric conversion device 410. The photoelectric conversion device 410 is any of the photoelectric conversion devices described in the above embodiments. The imaging system 400 has an image processing unit 412 that is a processing device configured to perform image processing on a plurality of data acquired by the photoelectric conversion device 410. Further, the imaging system 400 has a parallax acquisition unit 414 that is a processing device configured to calculate a parallax from the plurality of image data acquired by the photoelectric conversion device 410. Further, the imaging system 400 has a distance acquisition unit 416 that is a processing device configured to calculate a distance to an object based on the calculated parallax and a collision determination unit 418 that is a processing device configured to determine whether or not there is a collision possibility based on the calculated distance. Here, the parallax acquisition unit 414 or the distance acquisition unit 416 is an example of a distance information acquisition unit that acquires information such as distance information on the distance to an object. That is, the distance information is information on a parallax, a defocus amount, a distance to an object, or the like. The collision determination unit 418 may use any of the distance information to determine the collision possibility. Each processing device described above may be implemented by dedicatedly designed hardware or may be implemented by general purpose hardware that performs calculation based on a software module. Further, the processing device may be implemented by a Field Programmable Gate Array (FPGA), an Application Specific Integrated Circuit (ASIC), or the like or may be implemented by a combination thereof.

The imaging system 400 is connected to a vehicle information acquisition device 420 and can acquire vehicle information such as a vehicle speed, a yaw rate, a steering angle, or the like. Further, the imaging system 400 is connected to a control ECU 430, which is a control device that outputs a control signal for causing a vehicle to generate braking force based on a determination result by the collision determination unit 418. That is, the control ECU 430 is an example of a moving-unit control unit for controlling a moving unit based on the distance information. Further, the imaging system 400 is also connected to an alert device 440 that issues an alert to the driver based on a determination result by the collision determination unit 418. For example, when the collision probability is high as the determination result of the collision determination unit 418, the control ECU 430 performs vehicle control to avoid a collision or reduce damage by applying a brake, pushing back an accelerator, suppressing engine power, or the like. The alert device 440 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 400. FIG. 9B illustrates the imaging system 400 in a case of capturing a front area of a vehicle (a capturing region 450). The vehicle information acquisition device 420 transmits instructions to cause the imaging system 400 to operate and perform capturing. When the photoelectric conversion device described in the above embodiments is used as the photoelectric conversion device 410, the imaging system 400 of the present embodiment can further improve the ranging accuracy. Further, the vehicle may be controlled based on image recognition without performing ranging.

Although an example of control for avoiding a collision to another vehicle has been described in the description above, it is applicable to automatic driving control for following another vehicle, automatic driving control for not going out of a traffic lane, or the like. Furthermore, the imaging system is not limited to a vehicle such as the subject vehicle and can be applied to a moving unit (transport apparatus) such as a ship, an airplane, or an industrial robot, for example. A moving apparatus in the moving unit (transport apparatus) may be various units used for motion, such as an engine, a motor, a wheel, a propeller, or the like. In addition, the imaging system can be widely applied to a device which utilizes object recognition, such as an intelligent transportation system (ITS), without being limited to moving units.

According to the present disclosure, in a photoelectric conversion device that has the stacked structure and outputs a digital signal, a configuration that can accurately count photons can be provided.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-022024, filed Feb. 9, 2018, which is hereby incorporated by reference herein in its entirety.

What is claimed is:

1. A photoelectric conversion device comprising:
    an avalanche amplification-type diode;
    an inverter circuit that shapes output from the avalanche amplification-type diode into a pulse; and
    a signal processing circuit that processes a signal corresponding to output from the inverter circuit,
    wherein a first base body in which the avalanche amplification-type diode is provided and a second base body in which the signal processing circuit is provided are stacked on each other, and
    wherein the inverter circuit is provided in the first base body.

2. The photoelectric conversion device according to claim 1, wherein the signal processing circuit is a counter circuit that counts a signal corresponding to output from the inverter circuit.

3. The photoelectric conversion device according to claim 2 further comprising a pulse conversion circuit that converts a pulse signal having a first amplitude output from the inverter circuit into a pulse signal having a second amplitude that is smaller than the first amplitude, wherein the pulse conversion circuit is provided in the first base body.

4. The photoelectric conversion device according to claim 3,
wherein a first power source voltage and a second power source voltage are supplied to the avalanche amplification-type diode,
wherein a third power source voltage and a fourth power source voltage are supplied to the signal processing circuit, and
wherein a difference between the first power source voltage and the second power source voltage is larger than a difference between the third power source voltage and the fourth power source voltage.

5. The photoelectric conversion device according to claim 4, wherein the first power source voltage is a voltage on an anode side of the avalanche amplification-type diode, and the second power source voltage is a voltage on a cathode side of the avalanche amplification-type diode.

6. The photoelectric conversion device according to claim 5, wherein
wherein a fifth power source voltage and a sixth power source voltage are supplied to the inverter circuit,
wherein a seventh power source voltage and an eighth power source voltage are supplied to the pulse conversion circuit, and
wherein a difference between the seventh power source voltage and the eighth power source voltage is smaller than a difference between the fifth power source voltage and the sixth power source voltage.

7. The photoelectric conversion device according to claim 6, wherein the difference between the seventh power source voltage and the eighth power source voltage is larger than or equal to the difference between the third power source voltage and the fourth power source voltage.

8. The photoelectric conversion device according to claim 6, wherein the difference between the seventh power source voltage and the eighth power source voltage is equal to the difference between the third power source voltage and the fourth power source voltage.

9. The photoelectric conversion device according to claim 6, wherein the difference between the first power source voltage and the second power source voltage is larger than the difference between the fifth power source voltage and the sixth power source voltage.

10. The photoelectric conversion device according to claim 9, wherein the third power source voltage, the fifth power source voltage, and the seventh power source voltage are equal.

11. The photoelectric conversion device according to claim 10, wherein the second power source voltage and the sixth power source voltage are equal.

12. The photoelectric conversion device according to claim 11, wherein the fourth power source voltage and the eighth power source voltage are equal.

13. The photoelectric conversion device according to claim 1,
wherein the first base body comprises a first substrate and a first multilayer wiring structure,
wherein the second base body comprises a second substrate and a second multilayer wiring structure, and
wherein a wiring included in the first multilayer wiring structure and arranged on the second multilayer wiring structure side and a wiring included in the second multilayer wiring structure and arranged on the first multilayer wiring structure side are in contact with and connected to each other.

14. The photoelectric conversion device according to claim 13, wherein a micro lens is arranged on a side opposite to a side on which the first multilayer wiring structure of the first substrate is arranged.

15. The photoelectric conversion device according to claim 4, wherein the pulse conversion circuit is a circuit that converts a high-level output pulse from the second power source voltage to the fourth power source voltage.

16. An imaging system comprising:
the photoelectric conversion device according to claim 1; and
a processing device that processes a signal output from the photoelectric conversion device.

17. An imaging system comprising:
the photoelectric conversion device according to claim 4; and
a processing device that processes a signal output from the photoelectric conversion device.

18. A moving unit comprising:
the photoelectric conversion device according to claim 1;
a moving apparatus;
a processing device that acquires information from a signal output from the photoelectric conversion device; and
a control device that controls the moving apparatus based on the information.

19. A moving unit comprising:
the photoelectric conversion device according to claim 4;
a moving apparatus;
a processing device that acquires information from a signal output from the photoelectric conversion device; and
a control device that controls the moving apparatus based on the information.

20. The photoelectric conversion device according to claim 14 further comprising a color filter layer arranged between the first substrate and the micro lens.

21. The photoelectric conversion device according to claim 1, wherein a first power source voltage and a second power source voltage are supplied to the avalanche amplification-type diode, and
wherein the second power source voltage is applied to the signal processing circuit.

22. The photoelectric conversion device according to claim 21, wherein a third power source voltage is applied to the signal processing circuit, and the second power source voltage and the third power source voltage are applied to the inverter circuit.

* * * * *